(12) United States Patent
Walsh et al.

(10) Patent No.: US 10,490,987 B1
(45) Date of Patent: Nov. 26, 2019

(54) ELECTRICAL JUNCTION BOX

(71) Applicant: IDEAL Industries, Inc., Sycamore, IL (US)

(72) Inventors: Paul Walsh, Leicestershire (GB); Peter Viner, West Yorkshire (GB)

(73) Assignee: IDEAL Industries, Inc., Sycamore, IL (US)

( * ) Notice: Subject to any disclaimer, the term of this patent is extended or adjusted under 35 U.S.C. 154(b) by 0 days.

(21) Appl. No.: 16/027,648

(22) Filed: Jul. 5, 2018

Related U.S. Application Data

(63) Continuation-in-part of application No. 16/013,677, filed on Jun. 20, 2018, now abandoned.

(51) Int. Cl.
*H02G 3/08* (2006.01)
*H05K 5/02* (2006.01)
*H02G 3/14* (2006.01)
*H02G 3/16* (2006.01)

(52) U.S. Cl.
CPC .............. *H02G 3/083* (2013.01); *H02G 3/14* (2013.01); *H02G 3/16* (2013.01); *H05K 5/0226* (2013.01)

(58) Field of Classification Search
CPC .......... H02G 3/08; H02G 3/081; H02G 3/083; H02G 3/14; H02G 3/16; H02G 3/22; H02G 3/32; H02G 3/36; H05K 5/00; H05K 5/02; H05K 5/0226; H05K 5/0247
USPC ..... 174/50, 53, 57, 520, 650, 655, 653, 660; 220/3.2–3.8, 4.02; 248/68.1, 49
See application file for complete search history.

(56) References Cited

U.S. PATENT DOCUMENTS

| | | | | |
|---|---|---|---|---|
| 4,304,957 A | * | 12/1981 | Slater | H02G 3/123 174/58 |
| 4,304,958 A | * | 12/1981 | Neff | H02G 3/083 174/661 |
| 4,306,109 A | * | 12/1981 | Nattel | H02G 3/083 174/51 |
| 4,424,406 A | * | 1/1984 | Slater | H02G 3/123 174/660 |
| 4,605,816 A | * | 8/1986 | Jorgensen | H02G 3/083 174/661 |
| 4,972,044 A | * | 11/1990 | Kropa | H02G 3/083 174/660 |
| 6,278,061 B1 | * | 8/2001 | Daoud | H02G 3/22 174/660 |

(Continued)

*Primary Examiner* — Angel R Estrada
(74) *Attorney, Agent, or Firm* — Greenberg Traurig, LLP

(57) ABSTRACT

A junction box has a main body defining an interior space and a lid hingedly connected to the main body for use in enclosing the interior space. The main body includes an inlet for allowing an end of electrical cable to be positioned with the interior space. The inlet is formed by a first pair of spaced flaps between which is defined a first slot into which the electrical cable is to be positioned and a second pair of spaced flaps between which is defined a second slot into which the electrical cable is to be positioned. Each of the first pair of flaps is arranged to extend outwardly from the defined first slot at an angle that is away from the interior space to provide a structure that will inhibit a pushing of the electrical cable further into the interior space. Each of the second pair of flaps is arranged to extend inwardly from the defined second slot at an angle towards the interior space to provide a structure that will inhibit a pulling of the electrical cable from the interior space.

11 Claims, 10 Drawing Sheets

(56) References Cited

U.S. PATENT DOCUMENTS

| | | | |
|---|---|---|---|
| 8,013,242 B1 * | 9/2011 | Thibault | H02G 3/185 174/481 |
| 8,960,973 B1 * | 2/2015 | Kathawate | H01R 4/70 174/92 |
| 8,962,997 B2 * | 2/2015 | Conway | H05K 5/0247 174/481 |
| 2011/0132657 A1 * | 6/2011 | Brewer | H02G 3/083 174/520 |

* cited by examiner

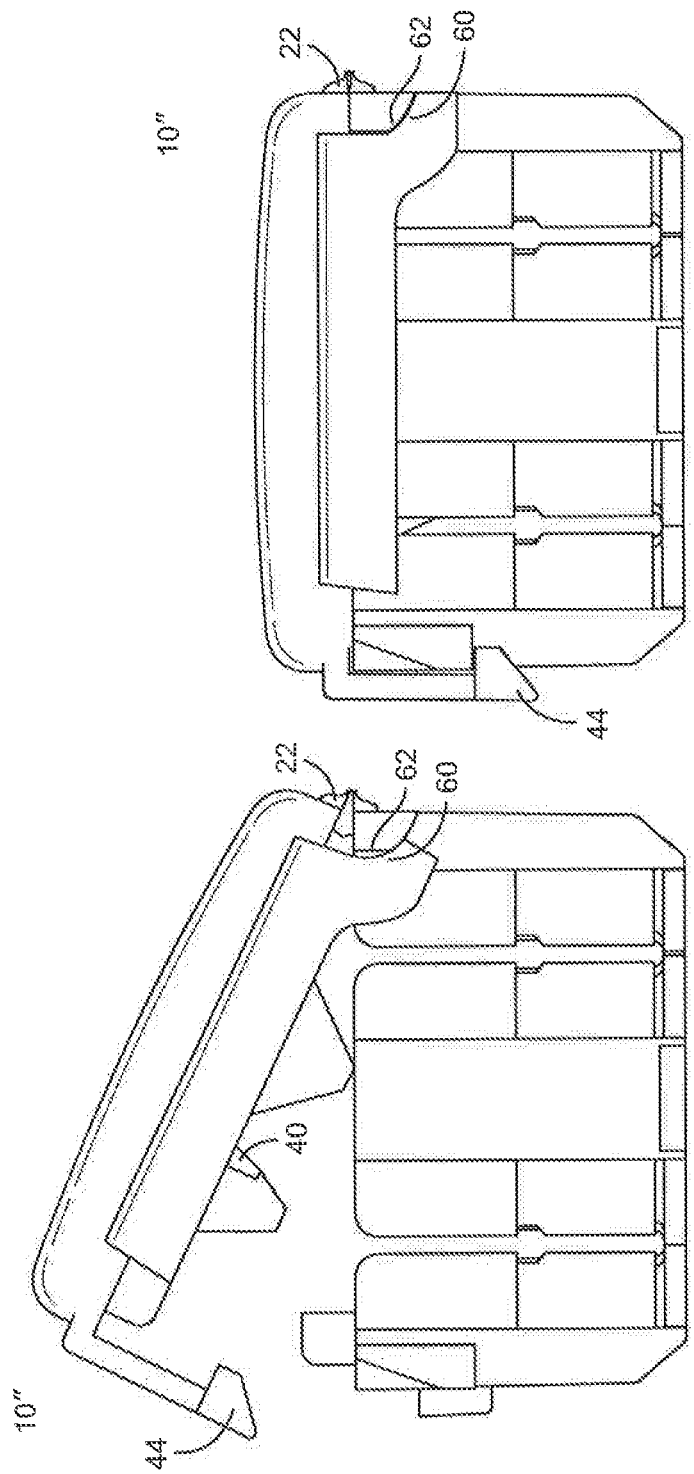

ELECTRICAL JUNCTION BOX

FIELD OF THE DISCLOSURE

The following generally relates to electrical junction boxes.

BACKGROUND OF RELATED ART

Some industry regulations require that electrical terminals shall not be subject to undue stress, that is, that the electrical cables entering the junction box should be securely retained therein. While such regulations are likely to become more widespread over time, the stress placed on electrical terminals should be reduced wherever possible in order to provide a secure connection for the consumer, and thereby reduce various risks, such as damage or fire.

US Patent Application No. 2011/0132657 describes a junction box for electrical cables comprising a main body comprising a base, an accepting wall with means for accepting cables through the wall, two walls substantially adjacent to the accepting wall and substantially opposite one another, and an electrical connector within the walls, wherein the means for accepting cables comprises at least two slots which are positioned one on either side of a central spacer and whose edges define with the adjacent spacer edges a cable gripping mechanism.

While the above-identified device may work for its intended purpose, one problem, among others, is that any cable entering the described junction box may be pushed further into the box over time, thereby bending, loosening, or otherwise damaging the cable and/or electrical connection inside the box, which may present a potential electrical hazard.

Accordingly, there is an identifiable need for an improved junction box as disclosed hereinafter.

SUMMARY

For use in addressing the issues noted above, described hereinafter is a junction box having a main body that functions to define an interior space and a lid that is hingedly connected to the main body for use in enclosing the interior space. The main body includes an inlet for allowing an end of an electrical cable to be positioned with the interior space. The inlet is formed by a first pair of spaced flaps between which is defined a first slot into which the electrical cable is to be positioned and a second pair of spaced flaps between which is defined a second slot into which the electrical cable is to be positioned. Each of the first pair of flaps is arranged to extend outwardly from the defined first slot at an angle that is away from the interior space to provide a structure that will inhibit a pushing of the electrical cable further into the interior space. Each of the second pair of flaps is arranged to extend inwardly from the defined second slot at an angle towards the interior space to provide a structure that will inhibit a pulling of the electrical cable from the interior space.

While the foregoing provides a general description of the subject junction box, a better understanding of the objects, advantages, features, properties, and relationships of the subject junction box will be obtained from the following detailed description and accompanying drawings which set forth illustrative embodiments and which are indicative of the various ways in which the principles of the invention hereinafter claimed may be employed.

BRIEF DESCRIPTION OF THE DRAWINGS

FIG. 15 is a side view of the junction box of FIG. 14 in a partially closed position.

FIG. 16 is a side view of the junction box of FIG. 14 in a fully closed position.

DETAILED DESCRIPTION

Figure 1:
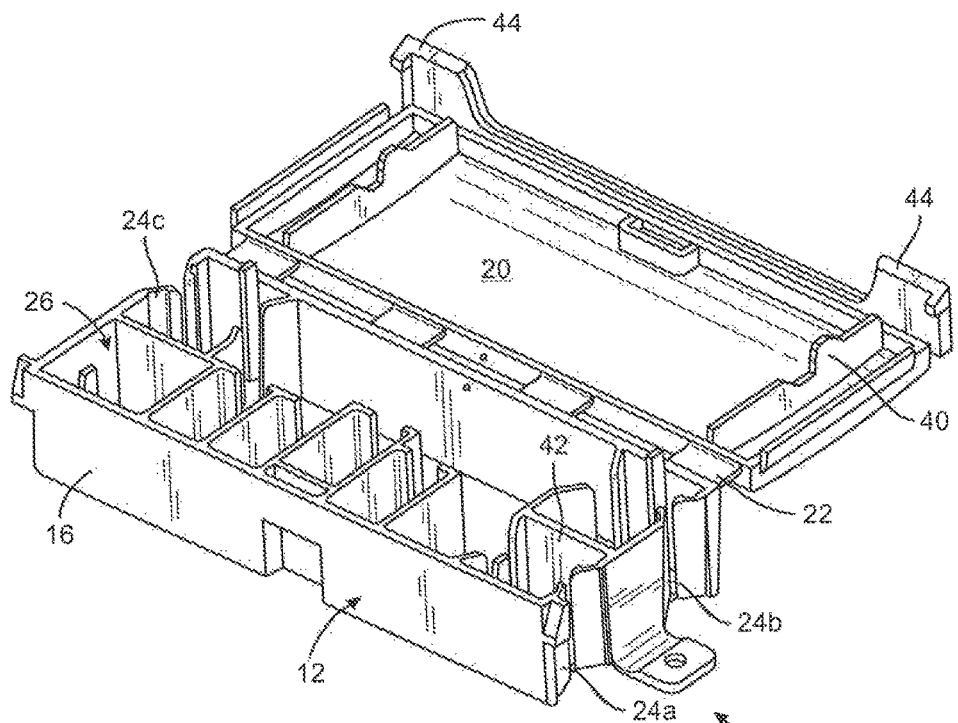
FIG. 1 is a top, perspective view of an example junction box constructed in accordance with the teachings of the present disclosure, showing the example junction box in an open position.
Figure 2:
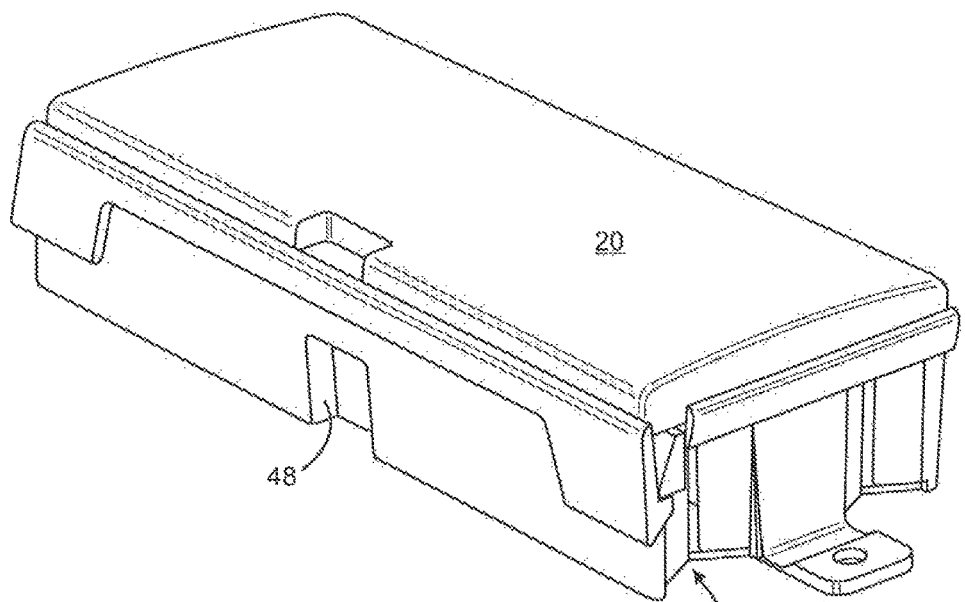
FIG. 2 is a top, perspective view of the example junction box of FIG. 1, showing the example junction box in a closed position.
Figure 3:
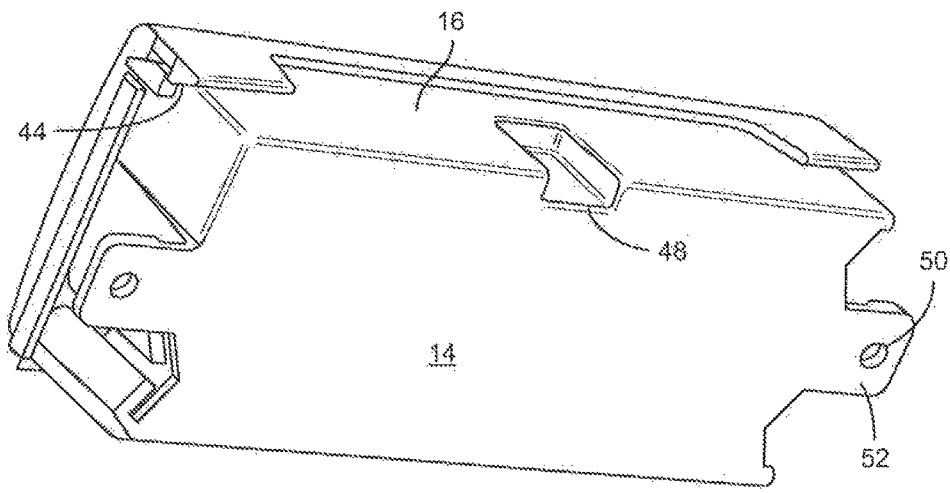
FIG. 3 is a bottom, perspective view of the example junction box of FIG. 2.
Figure 4:
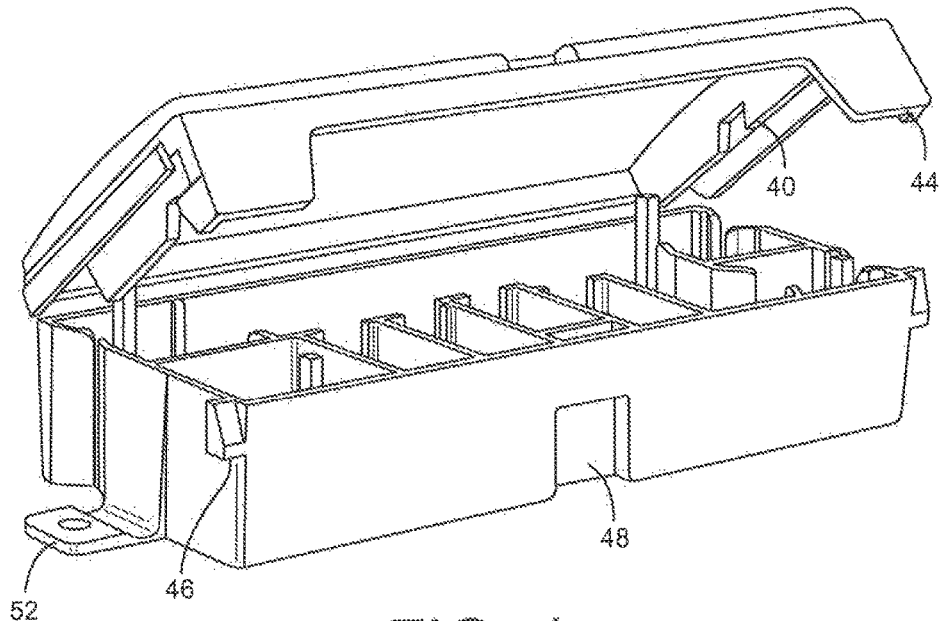
FIG. 4 is another top, perspective view of the example junction box of FIG. 1, showing the example junction box in a partially opened position.
Figure 5:
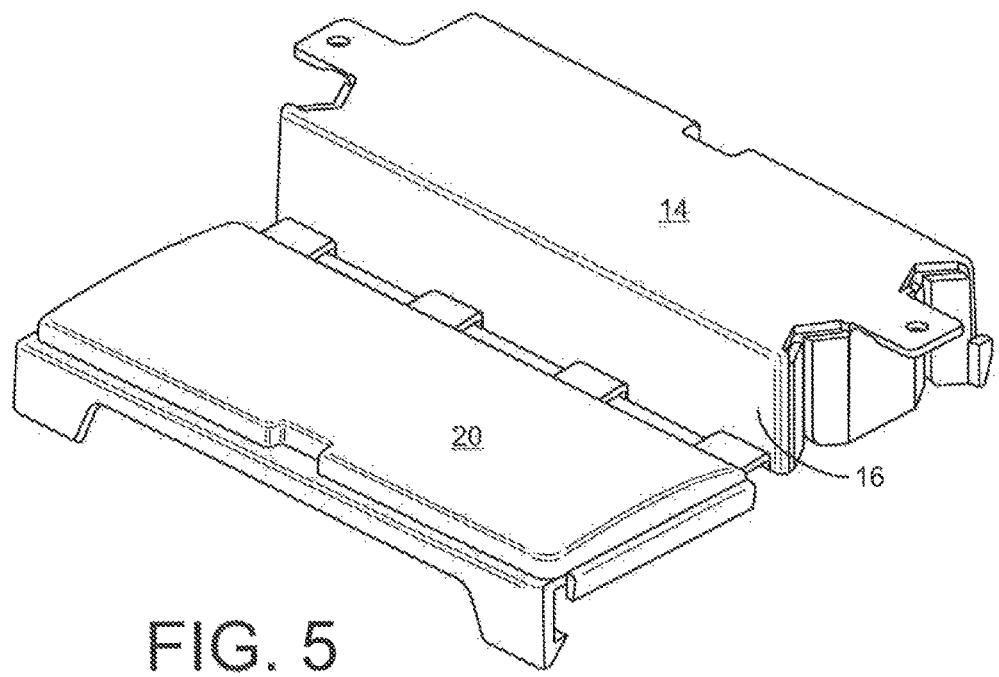
FIG. 5 is a bottom, perspective view of the example junction box of FIG. 1.
Figure 6:
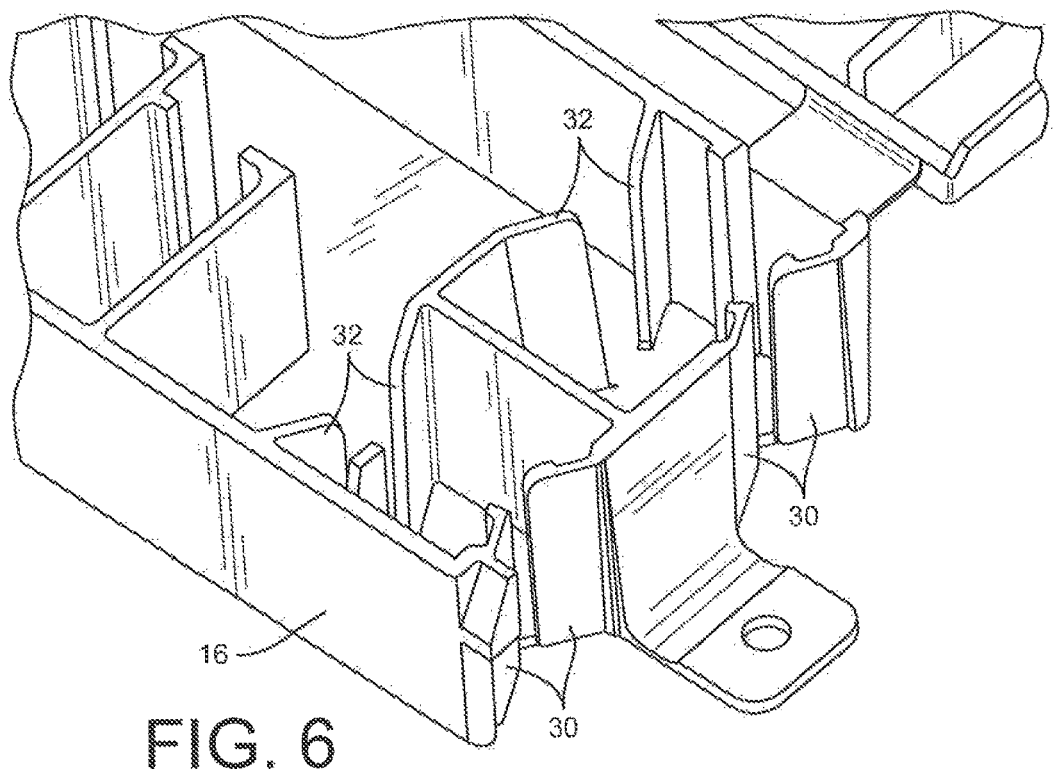
FIG. 6 is an enlarged, partial view of the example junction box of FIG. 1.

The following description of example methods and apparatus is not intended to limit the scope of the description to the precise form or forms detailed herein. Instead the following description is intended to be illustrative so that others may follow its teachings.

Referring now to the figures, an example junction box 10 is shown and disclosed herein. The example junction box 10 generally comprises a box-like enclosure 12 including a base 14 and an outer wall 16 disposed along and extending upwardly from the circumference of the base 14 to thereby create an interior space 26. A lid 20 is pivotally attached to a portion of the outer wall 16 via at least one living hinge 22 whereby the lid 20 may be moved towards the opposite portion of the outer wall 16 to enclose the interior space 26. It will be appreciated by one of ordinary skill in the art that the shape and construction of the example junction box 10 may vary as desired. Furthermore, it will be appreciated that the location and/or method of attaching the lid 20 to the outer wall 16 of the example junction box 10 may be changed as preferred.

The outer wall 16 is provided with at least one inlet 24, and in this example, the outer wall 16 is provided with a first inlet 24a, a second inlet 24b, and a third inlet 24c. The example inlets 24a, 24b, 24c are, in this example, in the form of slots extending at least partially between the base 14 and the lid 20. As noted above, the outer wall 16 defines the interior space 26, which in this example, includes various optional compartments sized and shaped to receive and hold a push-wire connector, such as for instance IDEAL Wire Connectors Models 32, 33, 34, 52, 53, and 42, among others.

In the illustrated examples, the inlets 24a, 24b, 24c each includes a pair of inwardly facing flaps 30 and a pair of outwardly facing flaps 32 spaced from the inwardly facing flaps 30. The flaps 30, 32 are typically made from the same material as the outer wall 16, but it will be appreciated that the flaps can be integrally or separately formed as desired. In use, a wire 34 is inserted into an inlet 24a, 24b, 24c such that the wire 34 extends into the interior compartment 26. As will be understood, and as noted above, the wires 34 are typically also inserted into a wire connector positioned within the interior space 26 and/or otherwise secured within the interior space 26.

Figure 8:
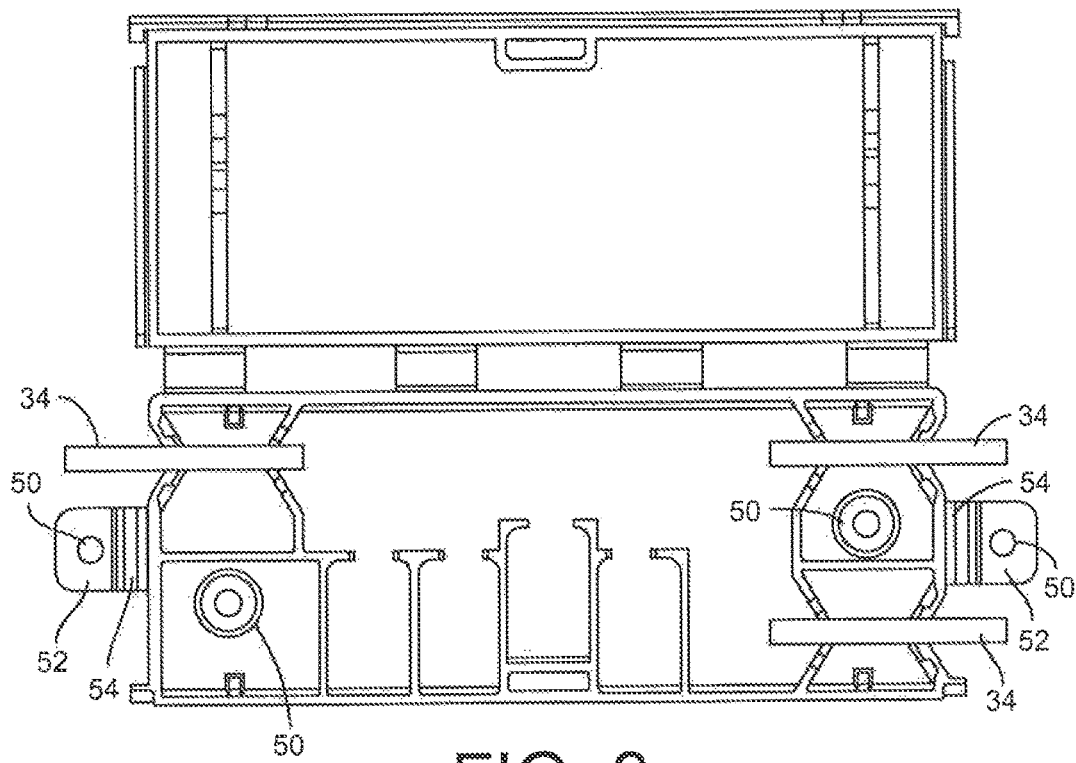
FIG. 8 is an outline, top plan view of the example box of FIG. 1, showing an example cable layout as inserted into the junction box.
Figure 9:
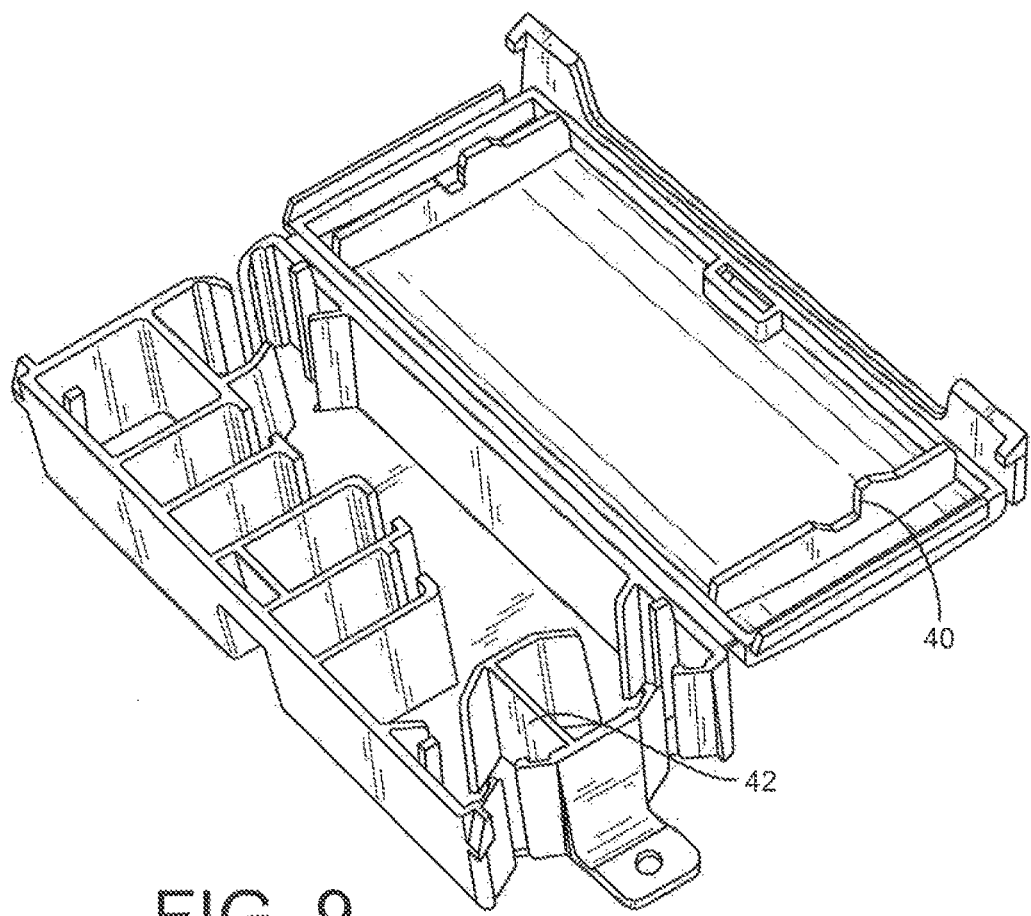
FIG. 9 is a top perspective view of the example junction box of FIG. 1, showing an extended hinge.
Figure 10:
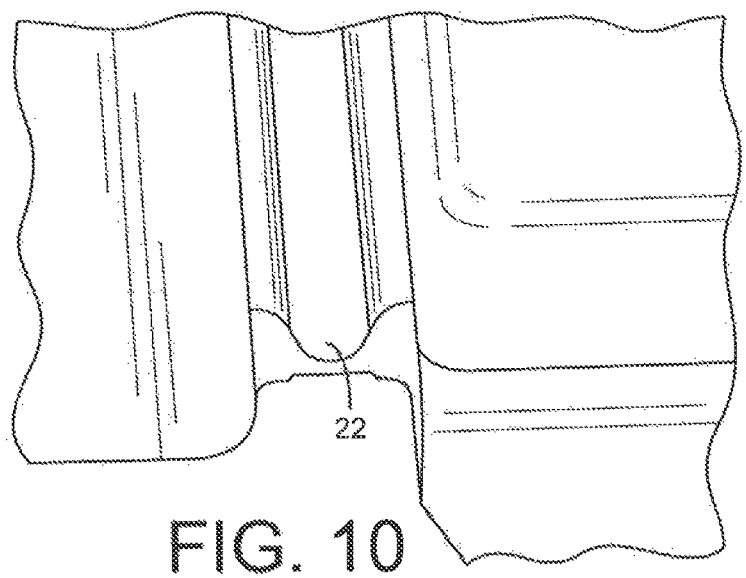
FIG. 10 is an enlarged partial view of the example hinge of FIG. 9.

As can be seen in FIG. 8, in use the outer flaps 30 and the inner flaps 32 are laterally spaced so as to hold and/or grip a wire 34 inserted into a slot that is formed between the opposed flaps of the respective inlets 24a, 24b, 24c. Due to the inwardly extending configuration of the outer flaps 30 (e.g., the flaps are each arranged to extend at an angle away from the slot defined therebetween and towards the interior space 26), the outer flaps 30 will inhibit an outward pulling of the inserted wire 34 from the interior space 26, i.e., the pulling of the inserted wire in a direction that is away from the interior space 26. Similarly, due to the outwardly extending configuration of the inner flaps 32 (e.g., the flaps are each arranged to extend at an angle away from the slot defined therebetween and away from the interior space 26), the inner flaps 32 will inhibit a pushing of the inserted wire 34 into the interior space 26, i.e., the pushing of a wire in a direction that is towards the interior space 26. In other words, the flaps 30 and 32 will bite into and/or otherwise grip the insulation jacket of a traditional wire conductor and securely hold the wire 24 in the box 10, inhibiting the wire from being pulled out and further pushed into the box 10.

Figure 7:
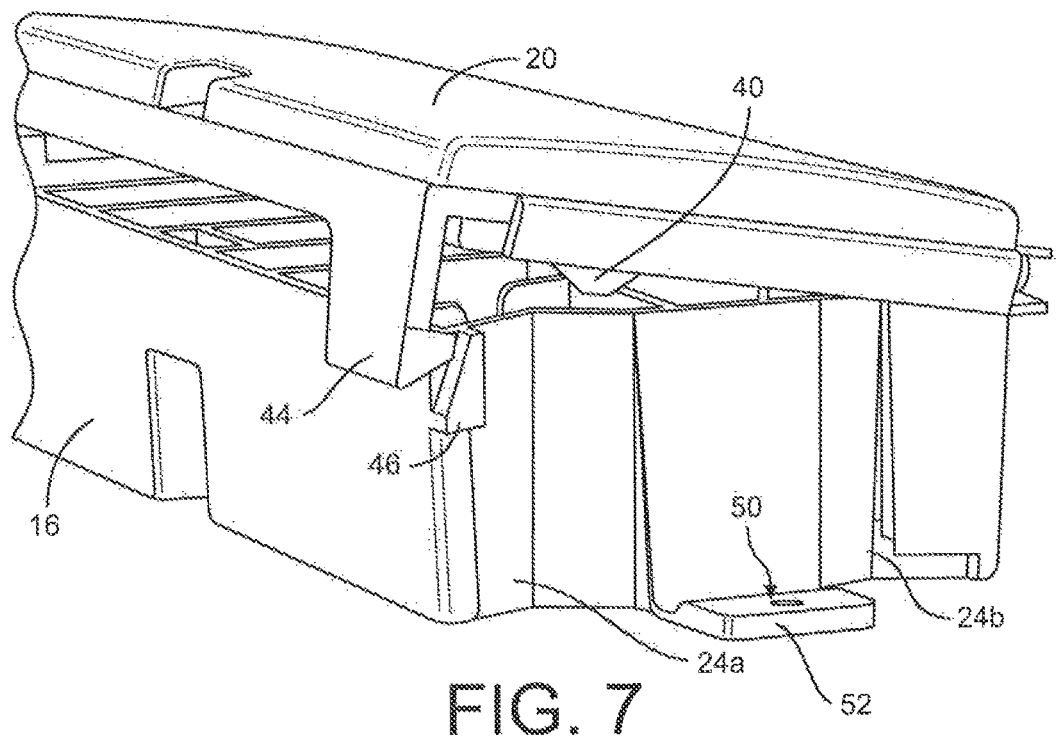
FIG. 7 is an enlarged front, perspective view of the example junction box of FIG. 1, showing the closing action of an example lid.

As will be appreciated by one of ordinary skill in the art, the insertion of the wire 34 into the inlets 24a, 24b, 24c, will naturally spread the inlets 24a, 24b, 24c outward, thereby "bowing" the box 10 slightly outward. To assist in closing this "bowed" box 10, the lid 20 includes a cammed locator surface 40. The locator surface 40 is located such that it contacts an upward standing wall 42 located within the compartment 26. The locator surface 40 will then apply a force upon the cooperating wall that functions to pull the box 10 towards its natural position for the purpose of generally inhibiting the first and second slots defined by the respective flaps from expanding when the lid is in the closed position relative to the interior space. Further, as seen in FIG. 7, the lid 20 includes at least one inwardly projecting tab or latching element 44. In this example, the inwardly projecting tabs 44 are located at each end of the lid 20. When the lid is closed, each of these tabs 44 contacts the underside of a corresponding lip 46 located along the top edge of the outer wall 16. This contact then locks or latches the lid 20 in place.

Figure 17:
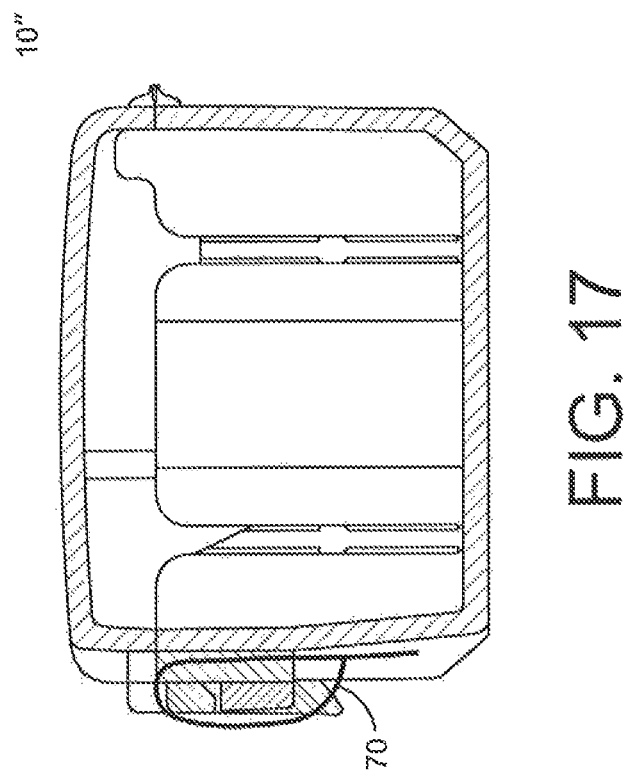
FIG. 17 is a cross-sectional view of a junction box illustrating the use of a cable tie to maintain the junction box in a closed position.

To further secure the box 10, the outer surface of the box 10 may include a channel 48. The channel 48 may be configured to accept a suitable securement device, such as a cable tie 70 or the like as illustrated in FIG. 17. Finally, for use in mounting the box 10 to a structure, the base 14 may optionally include at least one mounting aperture 50 (or area that is otherwise predesignated to receive mounting hardware, for example by having less material). As best seen in FIG. 8, the mounting aperture 50 may be located inside the interior space 26, or external of the outer wall 16. In this instance, the example box 10 includes two external mounting apertures 50, each of which are defined on an external mounting tab 52 extending outward from the base 14. The external fixing tab 52 may be hingedly coupled to the base 14, such as for example by a living hinge 54, such that the tabs 52 may be folded up for packaging and/or easily removed if desired.

Figure 11:
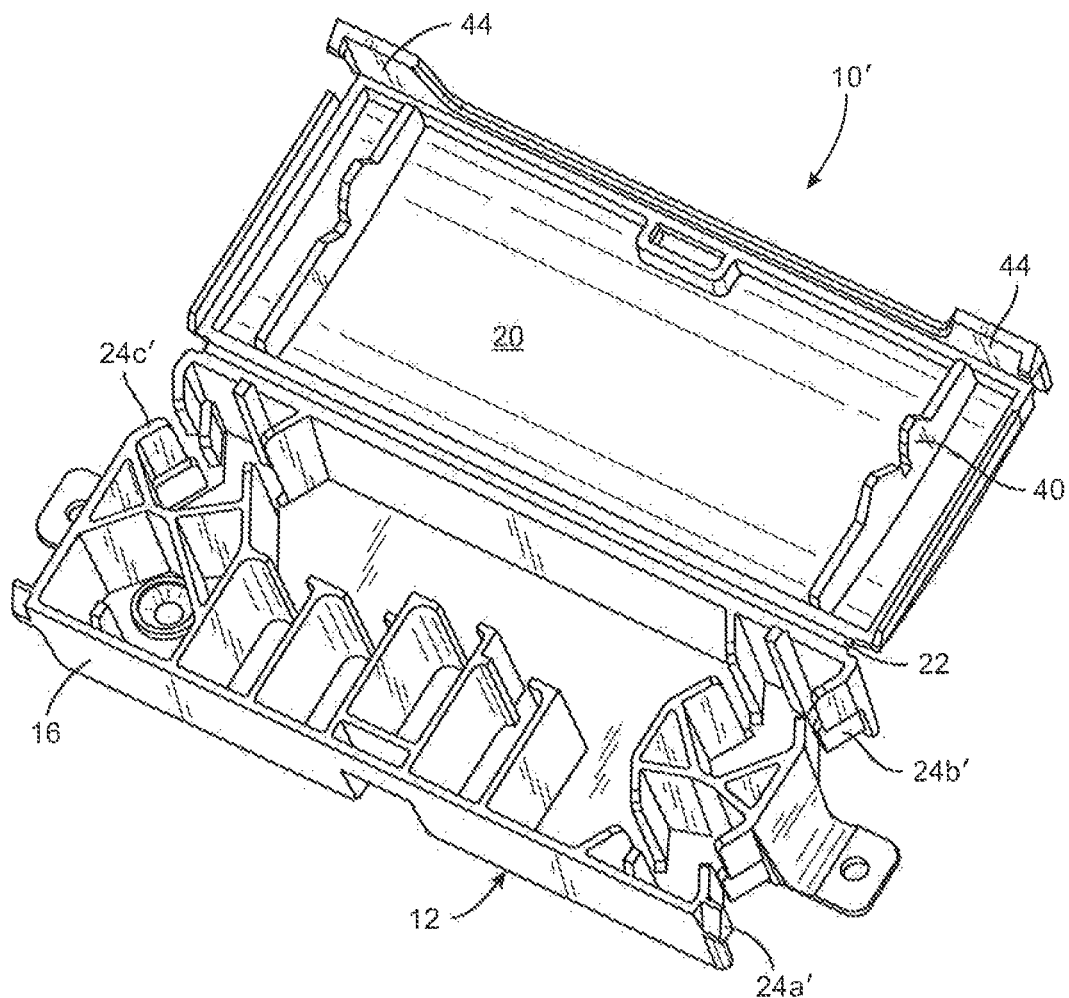
FIG. 11 is a front, perspective view of a further example junction box constructed in accordance with the teachings of the present disclosure.
Figure 12:
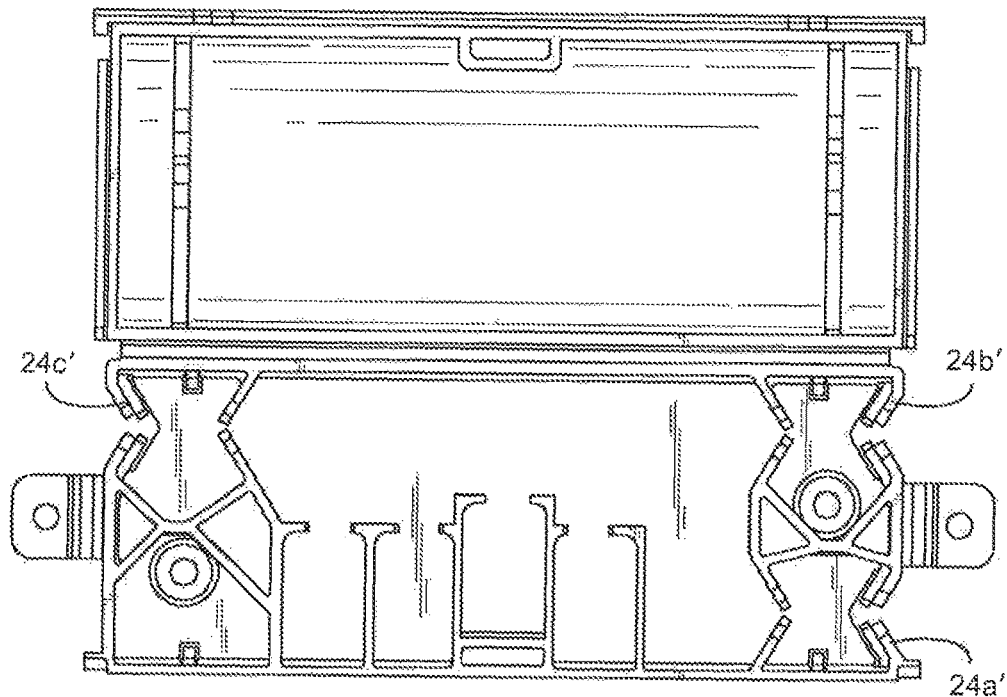
FIG. 12 is a top plan view of the example junction box of FIG. 11.
Figure 13:
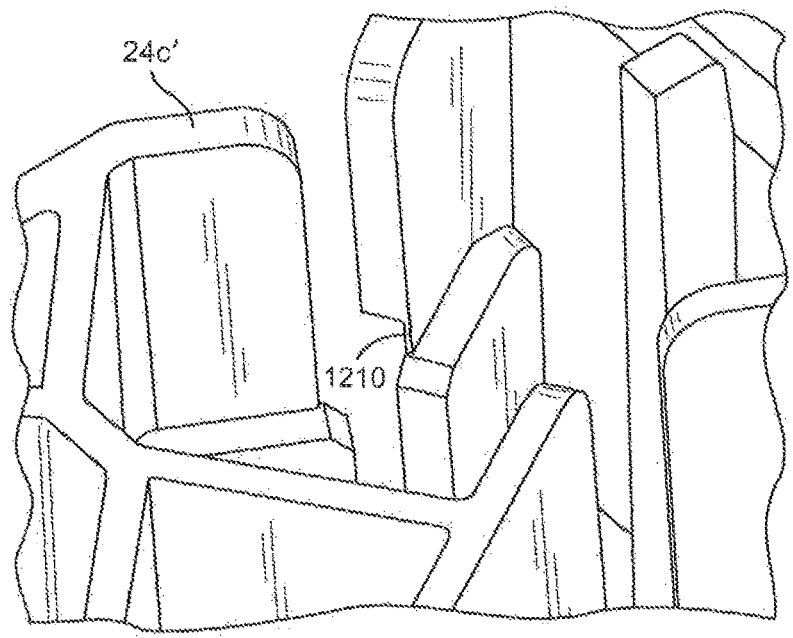
FIG. 13 is an enlarged partial view of the example junction box of FIG. 11.

Referring now FIGS. 11 and 12, another example junction box 10' is shown and disclosed. The example junction box 10' being similar in construction to the junction box 10. In this example, the junction box 10' comprises a modified "step" inlet design. Specifically, the junction box 10' includes a first stepped inlet 24a', a second stepped inlet 24b', and a third stepped inlet 24c'. The inlets 24a', 24b', and 24c' are, in this example, in the form of stepped slots extending at between the base 14 and the lid 20. As shown in FIG. 13, the "stepped" section includes a thinner, flexible wall portion 1210 that will bend, deform, and/or otherwise flex (resiliently, permanently, or semi-permanently) to provide an adaptable retention force to an inserted conductor or wire 34. Thus, the inlets are modified to allow the inlets to accommodate wires of different diameters.

Figure 14:
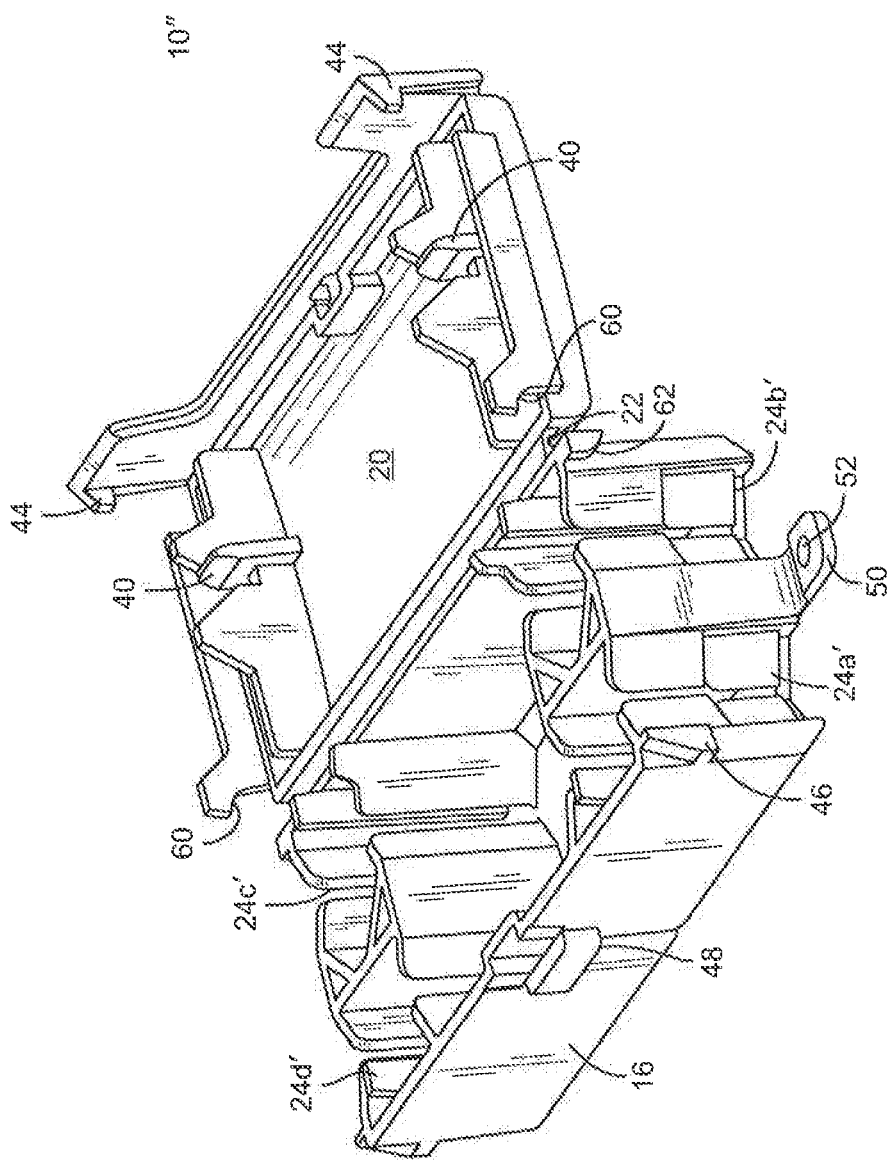
FIG. 14 is a top, perspective view of a yet further example junction box constructed in accordance with the teachings of the present disclosure, showing the example junction box in an open position.

Referring now to FIGS. 14-16, a still further example junction box 10" is shown and disclosed. The example junction box 10" is generally similar in construction to the junction boxes previously described with the addition of certain elements described below. In the illustrated example, the junction box 10" is shown without the optional, interior space compartments that would be sized and shaped to receive and hold a push-wire connector. More particularly, the example junction box 10" includes an additional modified "step" inlet 24d' having the corresponding outer flaps for resisting the outward pulling of an inserted wire 34 from the interior space 26 and inner flaps for resisting the pushing of the inserted wire into the interior space 26. Furthermore, the lid 20 also provided with one or more hook surfaces 60 that are used to engage/mate with corresponding surfaces 62 that are provided to the junction box 10". When the lid 20 is closed, the engagement between the hook surfaces 60 and the corresponding surfaces 62 will generally function to protect the hinge 22. As will also be appreciated that, as the lid 20 is being closed, the position of the hook surfaces 60 proximate to the hinge 22 will allow the hook surfaces 60 to start engagement with the corresponding surfaces 62 before the locator surfaces 40 will engage with their corresponding surfaces as described previously.

Although certain example methods and apparatus have been described herein, the scope of coverage of this patent is not limited thereto. On the contrary, this patent covers all methods, apparatus, and articles of manufacture fairly falling within the scope of the appended claims either literally or under the doctrine of equivalents.

What is claimed is:

1. A junction box, comprising:
   a main body defining an interior space including at least one corresponding structure; and
   a lid hingedly connected to the main body for use in enclosing the interior space, the lid comprising a projection extending from the lower surface of the lid;

wherein the outer wall of the main body includes at least one inlet for allowing an end of an electrical cable to be positioned within the interior space and wherein each inlet comprises:
a first pair of spaced flaps, distinct from the outer wall of the main body, between which is defined a first slot with a first diameter into which the electrical cable is to be positioned; and
a second pair of spaced flaps between which is defined a second slot with a second diameter into which the electrical cable is to be positioned, the first pair of spaced flaps being more proximate to the interior space relative to the second pair of spaced flaps,
wherein each of the first pair of flaps is arranged to extend outwardly from the defined first slot at an angle that is away from the interior space to provide a structure that will inhibit a pushing of the electrical cable, when disposed in the first slot, further into the interior space, and
wherein each of the second pair of flaps is arranged to extend inwardly from the defined second slot at an angle towards the interior space to provide a structure that will inhibit a pulling of the electrical cable, when disposed in the second slot, from the interior space,
wherein the lid projection imparts a force upon a corresponding structure of the main body located in the interior space and causes a reduction in the first or second diameter of the first and second slot, respectively.

2. The junction box as recited in claim 1, wherein the first slot and the second slot are generally aligned.

3. The junction box as recited in claim 1, wherein at least the second pair of flaps are arranged such that second slot is adapted to accommodate electrical cables of multiple different diameters.

4. The junction box as recited in claim 1, wherein the first pair of flaps and the second pair of flaps are integrally molded with the main body.

5. The junction box as recited in claim 1, wherein the lid is connected to the main body via use of a living hinge.

6. The junction box as recited in claim 5, wherein the projection is a first projection and the lid further comprises a first latch, comprising the first projection, the first engaging with a first corresponding structure provided to the main body at a location that is opposite to the living hinge, for use in maintaining the lid in a position that will enclose the interior space.

7. The junction box as recited in claim 6, wherein the lid further comprises a second latch, for engaging with a second corresponding structure provided to the main body at a location that is proximate to the living hinge, for use in maintaining the lid in the position that will enclose the interior space.

8. The junction box as recited in claim 7, wherein the outer wall including at least one inlet comprises a second inlet in spaced relation to the first inlet on the same wall face and wherein the lid comprises an internal locator structure with a second projection, for engaging with a third corresponding structure provided to the main body at a location that is intermediate the first corresponding structure and the second corresponding structure and intermediate the first and second inlets on the outer wall face, for inhibiting the first and second slots from expanding when the lid is in the position that will enclose the interior space, and
wherein the second projection imparts a force upon the third corresponding structure and causes a reduction in the other first or second diameter of the first and second slot, respectively, not reduced by the first projection.

9. The junction box as recited in claim 8, wherein the internal locator structure includes a cam surface.

10. The junction box as recited in claim 1, wherein the lid comprises an internal locator structure, for engaging with a corresponding structure provided to the main body proximate to the first and second pair of flaps, for inhibiting the first and second slots from expanding when the lid is in a position that will enclose the interior space.

11. The junction box as recited in claim 10, wherein the internal locator structure includes a cam surface.

* * * * *